(12) United States Patent
McKenna et al.

(10) Patent No.: US 6,471,806 B1
(45) Date of Patent: Oct. 29, 2002

(54) METHOD OF ADHERING A WAFER TO WAFER TAPE

(75) Inventors: Robert G. McKenna, Houston; R. Scott Croff, Allen, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 167 days.

(21) Appl. No.: 09/637,490

(22) Filed: Aug. 11, 2000

Related U.S. Application Data

(62) Division of application No. 09/088,671, filed on Jun. 2, 1998, now Pat. No. 6,129,811.
(60) Provisional application No. 60/048,654, filed on Jun. 5, 1997.

(51) Int. Cl.[7] .......................... G32B 35/00; H01L 21/46
(52) U.S. Cl. .................. 156/160; 156/229; 156/285; 438/118; 438/464
(58) Field of Search .................. 156/160, 229, 156/285, 290, 306.3, 391, 494, 499, 104; 438/118, 464; 100/210

(56) References Cited

U.S. PATENT DOCUMENTS

| | | | |
|---|---|---|---|
| 4,787,951 A | 11/1988 | Okamoto | 156/285 |
| 4,925,515 A | 5/1990 | Yoshimura et al. | 156/250 |
| 5,286,329 A | 2/1994 | Iijima et al. | 156/297 |
| 5,891,298 A * | 4/1999 | Kuroda et al. | 156/241 |
| 5,911,850 A * | 6/1999 | Zung | 156/344 |
| 5,961,768 A | 10/1999 | Tsujimoto | 156/285 |
| 6,007,654 A | 12/1999 | McKenna | 156/156 |
| 6,297,131 B1 * | 10/2001 | Yamada et al. | 438/118 |

* cited by examiner

*Primary Examiner*—Richard Crispino
*Assistant Examiner*—Sue A. Purvis
(74) *Attorney, Agent, or Firm*—Charles A. Brill; Wade James Brady, III; Frederick J. Telecky, Jr.

(57) ABSTRACT

A method and apparatus (10) for securing a fragile wafer (16) to a wafer tape (26) secured taut across a wafer frame (24). A gentle point force (72) is provided by a roller wheel (36) mounted on a rotatable arm (30) to securely adhere the wafer tape (26) to the backside of the wafer (16). Preferably, a spiral pattern (70) is formed by the rotating roller (36) to secure the wafer tape (26) to the wafer (16) to avoid forming air bubbles or creases between the wafer tape and wafer. The method and apparatus is especially suitable for securely adhering fragile wafers to wafer tape that are to be subsequently broken along kerfs.

10 Claims, 3 Drawing Sheets

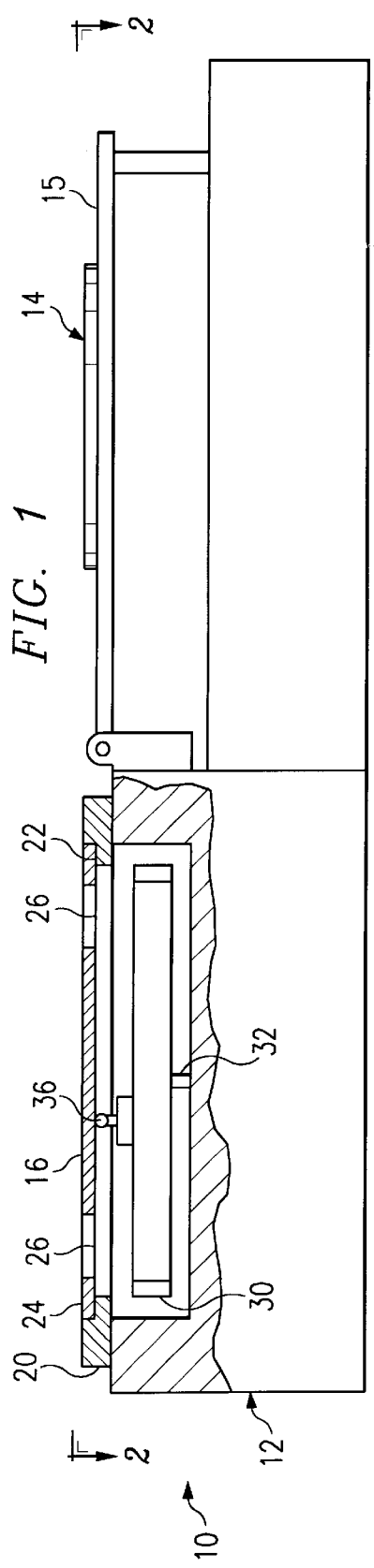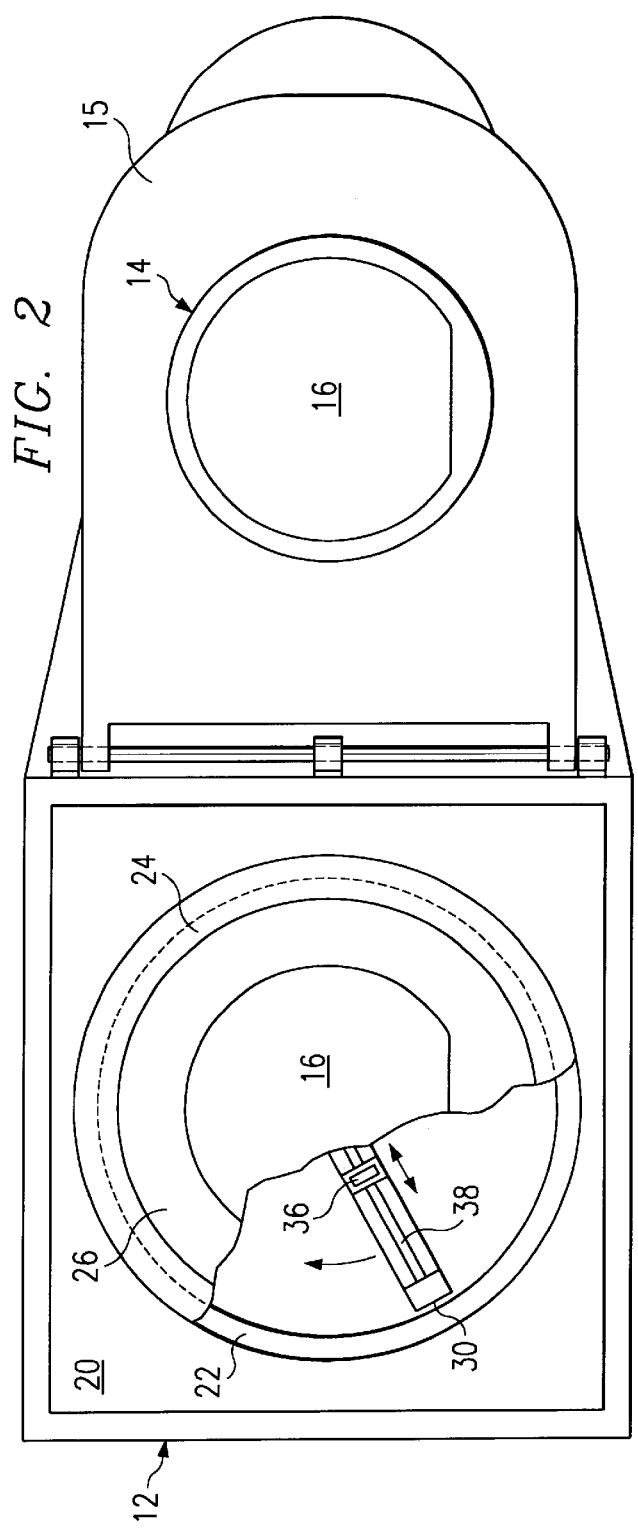

METHOD OF ADHERING A WAFER TO WAFER TAPE

This application is a Divisional of Application Ser. No. 09/088,671 filed Jun. 2, 1998, now U.S. Pat. No. 6,129,811 which claims priority from Provisional Application Ser. No. 06/048,654 filed Jun. 5, 1997

CROSS REFERENCE TO RELATED APPLICATIONS

Cross reference is made to the following co-pending patent applications, each being assigned to the same assignee as the present invention and the teachings included herein by reference:

| U.S. Ser. No. OR U.S. Pat. No. | TITLE | PRIORITY DATE |
|---|---|---|
| Ser. No. 08/974,772, now abandoned | UV EXPOSURE OF STRETCHED UV TAPE ON WAFER FRAMES TO ELIMINATE PREMATURE TAPE DELAMINATION FROM THE FRAME | 11-26-96 |
| Ser. No. 08/975,029 | METHOD AND APPARATUS FOR STRETCHING SAW FILM TAPE AFTER BREAKING A PARTIALLY SAWN WAFER | 11-26-96 |
| U.S. Pat. No. 6,007,654 | NONCONTACT METHOD OF ADHERING A WAFER TO A WAFER TAPE | 12-31-96 |
| U.S. Pat. No. 6,184,063 | METHOD AND APPARATUS FOR BREAKING AND SEPARATING DIE FROM A WAFER USING A MULTI-RADII DOME | 11-26-96 |

FIELD OF THE INVENTION

The present invention is generally related to the handling of semiconductor wafers, and more particularly to a method for securely adhering fragile wafers to a wafer tape including wafers that are already partially sawn.

BACKGROUND OF THE INVENTION

In the manufacture of semiconductor devices, it is conventional to form many integrated circuits or devices upon a single wafer of material, such as silicon. After the devices have been formed on the wafer, it is necessary to separate each device from one another such as by completely cutting the wafer into segments on which one or more devices or circuits have been formed, these segments commonly being referred to as die. For conventional integrated circuits, the completed wafer is protected with an overcoat of material, such as silicon dioxide. The completed wafer can then be securely adhered to an adhesive wafer tape stretched across a circular wafer frame, whereby the active wafer surface can be physically supported by a surface. Rollers or wheels may be rolled across the backside of the tape proximate the supported wafer to secure the tape to the wafer. The protective overcoat protects the active devices from damage during the physical application of force. The wafer can be completely sawn along the streets separating the individual circuits to form the die. The die remain securely adhered to the wafer tape, and are later removed by pick and place equipment for die packaging.

For devices that are unsuitable for a complete saw process, due to fragile elements on the surface of the wafer, a partial saw process may be performed. Such devices that are unsuitable for a complete saw process are micromechanical devices having moving parts including the digital micromirror device (DMD) manufactured by Texas Instruments of Dallas, Texas. Orthogonal lines may be scribed on the wafer, or a partial saw can be formed along the wafer streets extending between devices, the formed saw lines commonly being known as kerfs. A domed wafer is pressed against the wafer backside to break the wafer along these wafer kerfs to form individual die. One such method is taught in commonly assigned Ser. No. 08/975,378 entitled "Method and Apparatus for Breaking and Separating Die from a Wafer using a Multi-Radii Dome", and Ser. No. 08/975,029 entitled "Method and Apparatus for Stretching Saw Film Tape after Breaking a Partially Sawn Wafer", the teachings of which are incorporated herein by reference. If care is not taken during the breaking of the wafer, the individual die may be partially fractured or broken.

As illustrated in these cross referenced patent applications, the wafer break process is facilitated by placing the fabricated wafer upon a stretchable membrane such as wafer tape having an adhesive on one side. As the wafer is broken with an anvil, the tape is stretched to further separate the formed die from one another to avoid the die corners from rubbing against one another. After the wafer break process, pick and place equipment removes the individual die from the tape. These die are then packaged with leads and pins, the packaging comprising plastic, ceramic or other suitable material. Sometimes, the die are hermetically sealed in the package to prevent moisture from damaging the device, particularly if the device is a micromechanical device having moving elements.

It is important that the fabricated wafer is securely placed upon the stretchable membrane to achieve an effective wafer break, especially if the wafer is inverted during the wafer break process. It is preferred to invert the wafer during the wafer break such that any particles generated during the break fall downwardly and away from the fragile micromechanical devices. If the wafer is not sufficiently secured to the tape, the individual die may fall off the tape and be scraped. Any air bubbles need to be removed from between the tape and wafer to avoid die shifting and engaging one another.

There is disclosed in commonly assigned U.S. Pat. No. 6,007,654 entitled "Noncontact Method of Adhering a Wafer to a Wafer Tape" a noncontact method for securely adhering a fragile wafer to a wafer tape that is already partially sawn. Specifically, there is disclosed a noncontact method using a compressed gas to firmly attach the wafer tape to the wafer.

It is desired to provide an improved method and apparatus for securely adhering fragile semiconductor wafers to a wafer tape, particularly partially sawn wafers that are to be broken along kerfs to form individual die. It is especially desired to provide an improved method for adhering fragile wafers to an adhesive wafer tape that have fragile active surfaces which can not be physically pressed upon a support surface while securing the wafer to the tape. The fragile wafer needs to be securely adhered to the wafer such that it can be inverted, allowing particles generated during wafer break to fall downwardly without risk of the die inadvertently releasing from the wafer tape.

SUMMARY OF THE INVENTION

The present invention achieves technical advantages as a contact method and apparatus which applies a gentle concentrated point force to a backside of a wafer tape proximate a supported wafer, thereby securely adhering an opposing adhesive side of the tape to the wafer. The gentle point force is selectively applied with a roller to the wafer tape, as it is supported taut across a saw frame, with sufficient pressure to cause the sticky saw film to adhere to the back of the fragile semiconductor wafer, without causing it to break. Application of the roller pressure is a contact method which eliminates the necessity for physically handling or supporting the active surface of the wafer, such as a wafer having micromechanical devices. The present invention is especially suitable for mounting fragile wafers that are partially sawn and which are eventually separated by pressing an anvil against the back side of an inverted wafer.

According to the preferred method of the present invention, a concentrated point force is first directed upon and focused against the wafer tape proximate the center of the tape. The wafer is placed upon the protruding point and held in place by the force of gravity. The gentle point force is then rotated by a turntable and advanced outwardly below the wafer and wafer tape, thereby defining a spiral or helix pattern to securely adhere the wafer tape to the wafer without introducing air bubbles between the wafer tape and wafer. The width of the point force is sufficient to sweep a spiral path that overlaps the previous path. Preferably, there is a 20%–50% overlap of the spiral path to ensure any gas between the tape and wafer is directed radially outward and does not become entrapped between the tape and wafer. The point force pressure is selected such that the wafer does not break.

BRIEF DESCRIPTION OF THE DRAWINGS

FIG. 1 is an elevation view of the apparatus of the present invention suited to direct a gentle point force in a spiral path against a wafer tape supporting a wafer across a wafer frame;

FIG. 2 is a top view taken along lines 2—2 in FIG. 1 illustrating the placement of a wafer upon a roller which is rotated below the wafer and directed outwardly to create a spiral path shown in FIG. 5 to urge the wafer tape against the fragile wafer;

DESCRIPTION OF THE PREFERRED EMBODIMENT

Figure 3:
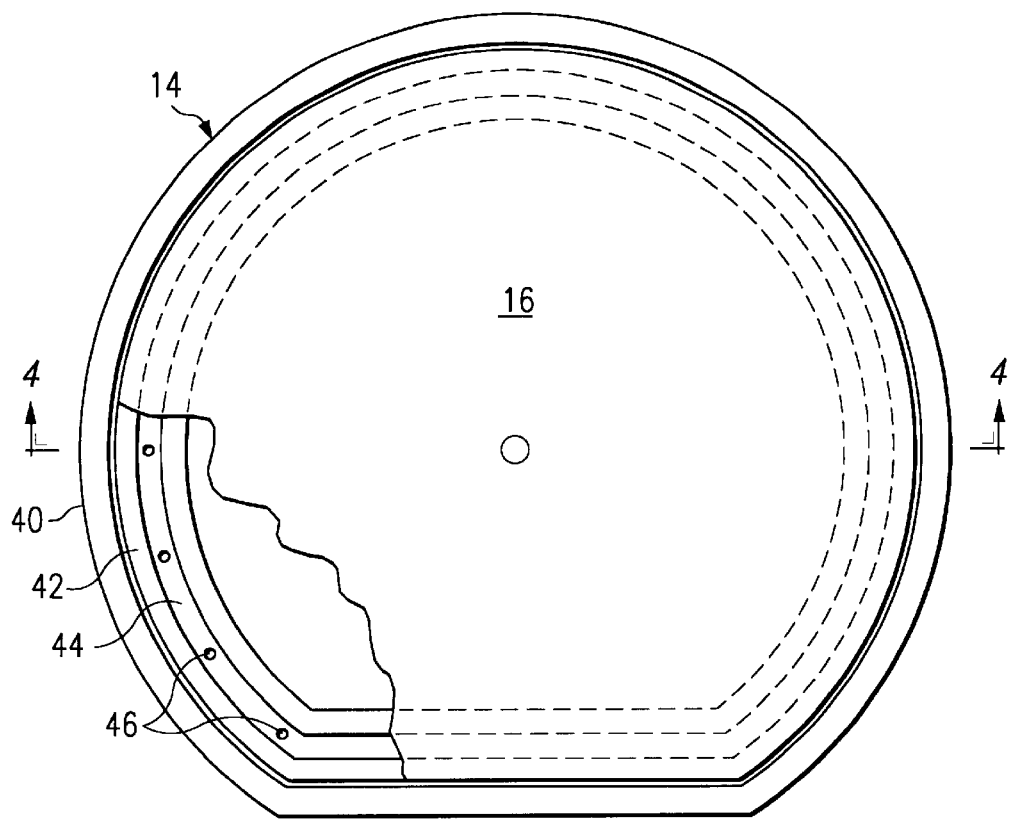
FIG. 3 is a top view of the lid section of the apparatus shown in FIG. 1 and FIG. 2 which is sectioned to illustrate a slot which distributes a vacuum through holes to secure the wafer to the lid as it is pivoted over the wafer tape until released on to the tape by removing the vacuum.

Referring now to FIG. 1, there is generally shown at 10 an apparatus according to the preferred embodiment of the present invention. Apparatus 10 is seen to include a wafer mounter section 12 and a wafer vacuum chuck 14 mounted on a hinged lid 15 for receiving a wafer 16 to be mounted. The wafer mounter section 12 securingly supports an annular saw-frame holder 20, the holder 20 being flanged at 22 to securingly receive a saw-frame 24. A saw film 26 having an adhesive upper surface facing upwardly is seen to be stretched across the saw frame 24 and is adapted to receive a wafer 16 to be attached thereto according to the present invention. A rotating arm 30 is seen to be rotatable by a rotor 32 rotatably driven by a motor (not shown) at a selected rate. Preferably, this rate is 100 RPM. Upwardly extending from the arm 30 is a pressure generating roller 36 which can be selectively elevated and longitudinally advanced to engage the stretched wafer tape 26, as will be described shortly.

Referring to FIG. 2, there can be seen the wafer mounter section 12 having the rotating pressure wheel 36. A rod 38 is mounted and recessed in arm 30. As illustrated, the pressure wheel 36 can be selectively advanced linearly along the rod 38 between a proximal and distal portion of the arm 30, as the arm 30 is rotated. This creates a spiral path of force against the wafer tape below the wafer, as will be described shortly in regards to FIG. 5.

Figure 4:
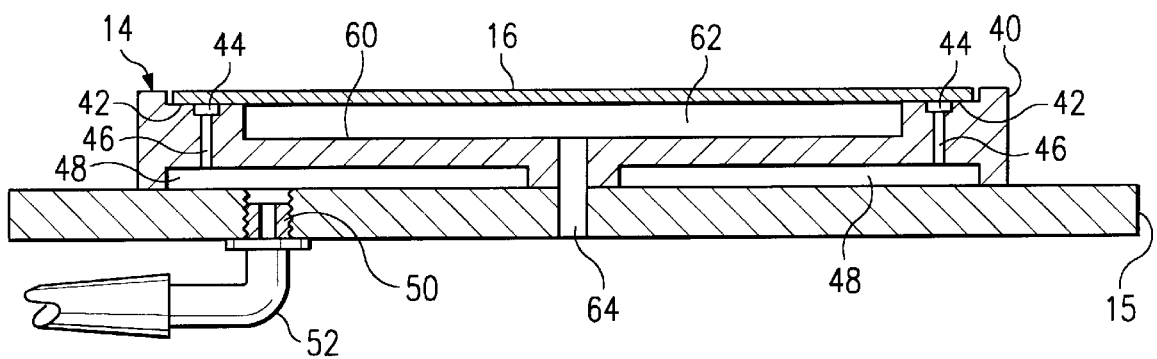
FIG. 4 is a sectional side view of the lid assembly taken along line 4—4 in FIG. 3 to illustrate how the wafer is secured to the lid by a vacuum prior to being hinged over the lower portion of the apparatus which applies the roller force against the tape beneath the wafer.

Referring now to FIG. 3 and FIG. 4, there is shown a top and sectional side view, respectively, of the lid portion 14 of apparatus 10. The lid assembly 14, in general, is commonly referred to as a vacuum chuck. A wafer 16 which is to be securely adhered to the adhesive tape 26 of wafer mounter section 12 is seen to be first placed within a conforming recess formed by a lid member 40. The lid member 40 is seen to be recessed having an annular shoulder 42 supporting the wafer 16 thereon. Defined within shoulder 42 is an annular recess 44 having a plurality of openings 46 extending therethrough to an annular vacuum chamber 48. There is provided an opening 50 extending from vacuum chamber 48 to a vacuum source 52. This vacuum source is selectively applied via the plurality of openings 46 to securely hold the wafer 16 upon the shoulder 42 during loading of the wafer 16 onto the bottom portion 12, as will be described shortly. The top member 40 is further seen to have a large central recess 60 defining a cavity 62 beneath the center portion of wafer 16. A vent opening 64 extends between cavity 62 and the ambient to prevent the formation of a vacuum under the wafer 16, thus preventing the wafer from being broken by pressure while it is held by the vacuum annularly provided around the periphery of the wafer by openings 46.

METHOD OF USE

To securely attach the wafer 16 to the stretched saw film 26 supported taut across the wafer frame or hoop 24, a partially sawn wafer 16 is first placed upon the annular shoulder 42 of top member 40. This can be done by automated equipment, whereby the active portion of the wafer 16 faces downwardly toward the cavity 62 shown in FIG. 4. A vacuum pressure is then applied to the perimeter of wafer 16 via the several openings 46, the vacuum being established by providing a vacuum through line 52, opening 50, cavity 48 and thus to openings 46.

Next, the lid 15 including the chuck portion 14 is hinged upwardly about a hinge 66 shown in FIG. 1 while the partially sawn wafer 16 is held in place on shoulder 42 by the vacuum provided to the periphery of the wafer. The bottom of the partially sawn wafer 16 is positioned just above the adhesive surface of the wafer tape 26. The vacuum pressure is then removed from source 52, allowing the partially sawn wafer 16 to drop freely onto the surface of the sticky film 26. The lid portion 14 is then opened again, such that it is not allowed to constrain the partially sawn wafer 16.

The drive motor (not shown) of the wafer mounter section 12 is turned on, causing the arm 30 including pressure wheel 36 to rotate under the adhesive saw film 26. The pressure wheel 36 is elevated slightly to engage the saw film 26 about the center portion of the wafer 16. The pressure wheel 36 may be heated, and is rolled against the backside of the adhesive tape 26 proximate the partially sawn wafer 16 causing the adhesive surface of the saw film 26 to be securely adhered to the wafer bottom surface. Since the partially sawn wafer 16 is freely unconstrained, the force of the rotating pressure wheel 36 causes the saw tape 26 to adhere to the surface of the wafer. A gentle force is applied by wheel 36 to prevent the partially sawn wafer to break.

As the pressure wheel 36 is gently urged against the saw film 26 beneath the wafer 16, the pressure wheel 36 is linearly advanced outward along the rod 38 of arm 30, shown in FIG. 2. Since the pressure wheel 36 is being rotated by arm 30, this creates a force in a spiral path, the path overlapping itself as shown at 70 in FIG. 5. That is, the width of the pressure applied by wheel 36 shown at 72, and the rate at which the pressure wheel 36 is advanced along the rod 38, is such that the spiral path 70 created actually overlaps itself between 20 and 50%.

It is necessary that air bubbles are not present between the tape and wafer, or the wafer may not properly break or separate along saw kerfs at a later time, which could inhibit the subsequent pick and place of the individual die from the wafer tape for ultimate packaging. While a spiral path is preferred, it is contemplated that other patterns can be utilized to securely adhere the wafer to the tape. For instance, the wheel 36 could be sequentially directed against the wafer tape beneath the wafer in horizontal lines, left-to-right, which lines overlap from line-to-line. A spiral method is preferred since a continuous path can be easily provided, and any air entrapped between the wafer and the tape is radially pushed outward toward the perimeter of the wafer along a line. If the roller pressure is applied left-to-right, similar to a raster-scan technique for displays, any entrapped air would be forced downwardly toward the bottom of the wafer which air will tend to accumulate along a shorter line. The accumulated air may tend to creep back toward a previously scanned area of the tape, and thus a larger overlap of the paths would be required.

Figure 5:
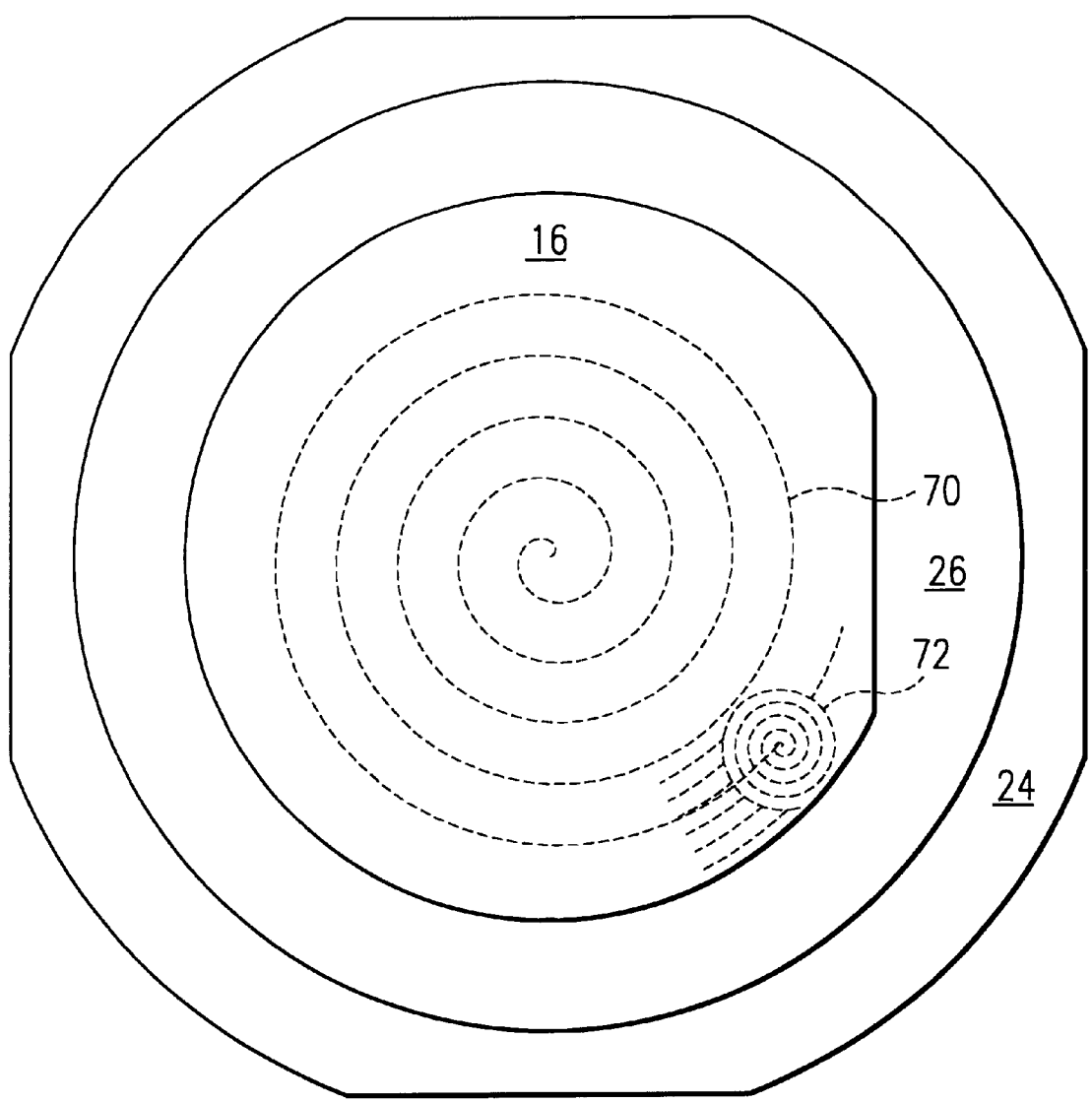
FIG. 5 is a view of the spiral path that the point force is applied to the wafer, illustrating the overlapping paths to avoid air bubbles.

For a 6 inch wafer, for example, arm 30 including the pressure wheel 36 is rotated at a rate of 100 rpm, and advanced linearly along rod 38 at a rate of 1 inch per minute, thus causing about 300 paths in a spiral pattern that overlap one another, as shown in FIG. 5. Although this is a preferred rate and method, other rotational and linear rates for the respective components could be chosen to ensure the wafer tape 26 is securely adhered to the wafer 16 to avoid any air bubbles becoming entrapped therebetween.

In summary, the present invention utilizes a gentle point force to adhere a wafer tape to a fragile wafer. The gentle point force is sufficient to achieve secured adhesion without causing the wafer to break. Further, the method applies a force without physically contacting the wafer active surface. That is, the face of the wafer does not need to be supported as the gentle point force is applied against the roller. This is especially suitable for processing fragile wafers that have micromechanical active surfaces, such as a DMD. The apparatus is rather simple, and cost effective for securely adhering a wafer to a wafer tape in preparation for a wafer break process.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A method of securing a wafer to a flexible adhesive membrane having an adhesive first surface and an opposing second surface, comprising the steps of:

a) placing a wafer proximate said adhesive first surface; and b) directing a point force against said membrane second surface proximate said wafer to increase adhesion of said membrane adhesive first surface to said wafer.

2. The method as specified in claim 1 wherein said wafer is carefully placed on said adhesive first surface in said step a).

3. The method as specified in claim 1 wherein said point force is directed from proximate a center of said wafer outwardly.

4. The method as specified in claim 3 wherein said point force is directed in a spiral path.

5. The method as specified in claim 4 wherein said spiral path has a width such that said path overlaps itself.

6. The method as specified in claim 1 wherein said point force is created by a roller.

7. The method as specified in claim 6 wherein said roller is heated as it is rolled against said membrane.

8. The method as specified in claim 1 wherein said wafer is positioned above said membrane adhesive first surface and has an upwardly extending active surface, and said point force is directed from below against said membrane second surface.

9. The method as specified in claim 4 comprising the step of rotating said wafer and said membrane as said point force is linearly advanced from a center of said membrane outwardly to define said spiral path.

10. The method as specified in claim 1 wherein said wafer is partially sawn, wherein said point force in insufficient to break said partially sawn wafer.

* * * * *